(12) United States Patent
Yen et al.

(10) Patent No.: US 11,224,147 B1
(45) Date of Patent: Jan. 11, 2022

(54) DIRECT COOLING OF INVERTER SWITCHES

(71) Applicant: GM GLOBAL TECHNOLOGY OPERATIONS LLC, Detroit, MI (US)

(72) Inventors: Chih-hung Yen, Bloomfield Hills, MI (US); Goro Tamai, Bloomfield Hills, MI (US); Konstantinos Triantos, Sterling Heights, MI (US); David R. Clark, Grosse Pointe Woods, MI (US); Tim M. Grewe, Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 16/952,149

(22) Filed: Nov. 19, 2020

(51) Int. Cl.
 *H05K 7/20* (2006.01)
 *H02M 7/00* (2006.01)

(52) U.S. Cl.
 CPC .......... *H05K 7/2089* (2013.01); *H02M 7/003* (2013.01)

(58) Field of Classification Search
 None
 See application file for complete search history.

(56) References Cited

U.S. PATENT DOCUMENTS

| | | | | |
|---|---|---|---|---|
| 4,268,850 A * | 5/1981 | Lazarek | ...................... | F28F 3/12 165/80.4 |
| 7,015,578 B2 * | 3/2006 | Nakamura | .............. | H01L 24/40 257/713 |
| 7,247,929 B2 * | 7/2007 | Miura | .................... | H01L 25/072 257/675 |
| 7,633,758 B2 * | 12/2009 | Oohama | ................. | H01L 24/36 361/717 |
| 8,675,364 B2 * | 3/2014 | Tokuyama | ............ | H01L 23/473 361/715 |
| 10,279,653 B2 * | 5/2019 | Takagi | ................ | H01L 23/3675 |
| 2004/0159962 A1 * | 8/2004 | Ishiyama | .............. | H01L 23/564 257/787 |
| 2006/0120047 A1 * | 6/2006 | Inoue | .................... | H01L 25/117 361/699 |
| 2014/0118934 A1 * | 5/2014 | Tokuyama | ............ | H02M 7/003 361/689 |
| 2015/0250074 A1 * | 9/2015 | Matsumoto | ........ | H05K 7/20936 361/696 |
| 2020/0093039 A1 * | 3/2020 | Tokuyama | ............ | H01L 25/072 |

* cited by examiner

*Primary Examiner* — Courtney L Smith

(57) ABSTRACT

A switch of an inverter module is disposed in a coolant channel, is configured to be immersed in coolant in the coolant channel, and includes: a first terminal disposed on a first plane and configured to connect to a direct current (DC) reference potential; a second terminal disposed on a second plane and configured to connect to an alternating current (AC) reference potential; a gate, an emitter, and a collector; first cooling features that extend away from the first and second planes, that directly contact the first terminal, and that are configured to allow coolant flow therethrough; and second cooling features that extend away from the first cooling features, the first plane, and the second plane, that directly contact the second terminal, and that are configured to allow coolant flow therethrough.

20 Claims, 16 Drawing Sheets

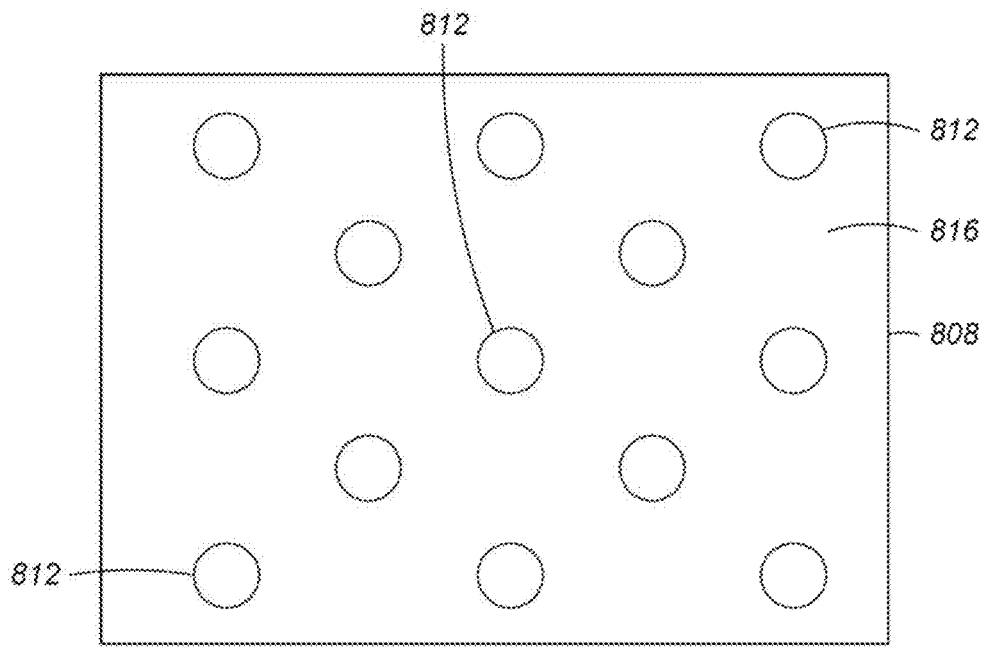
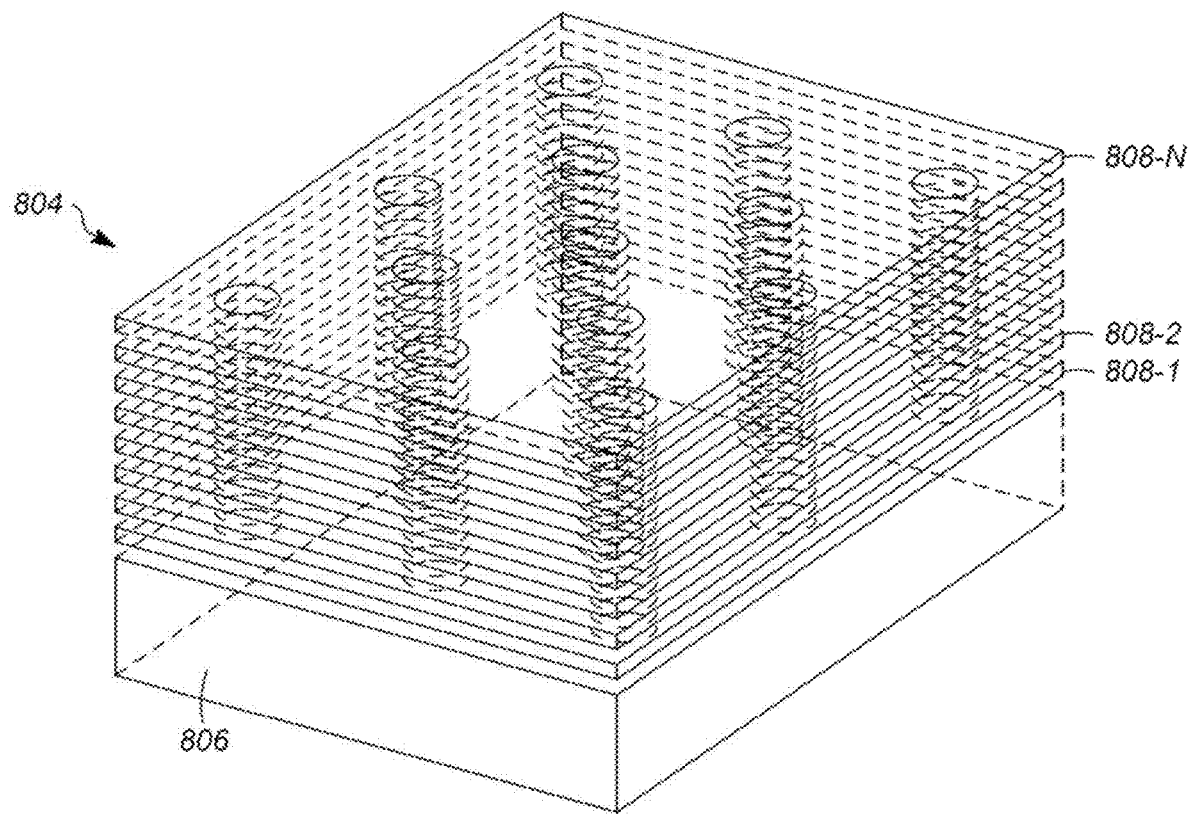
FIG. 8

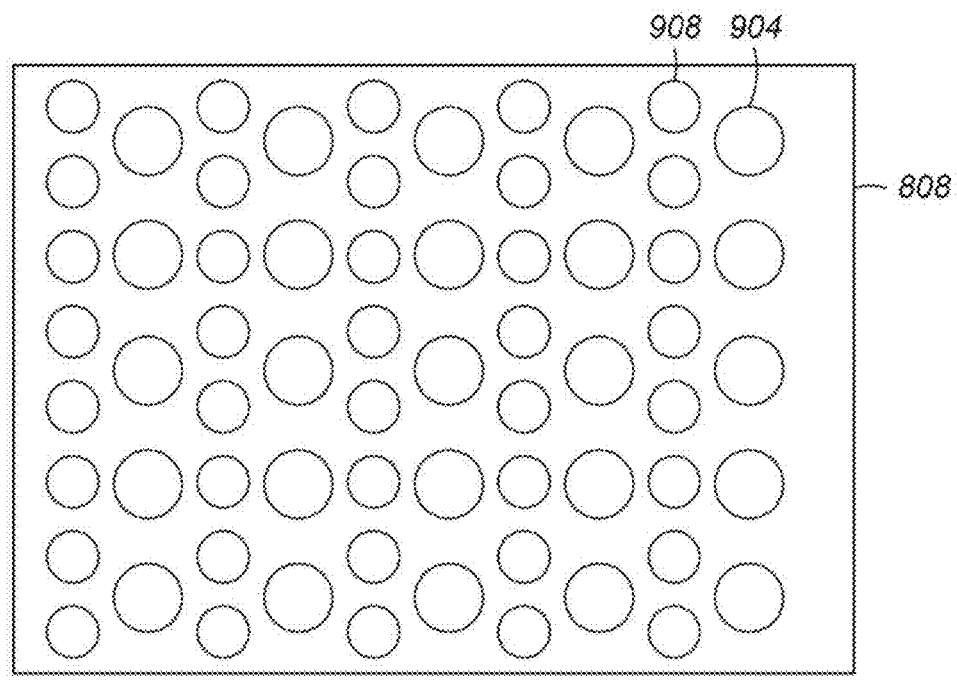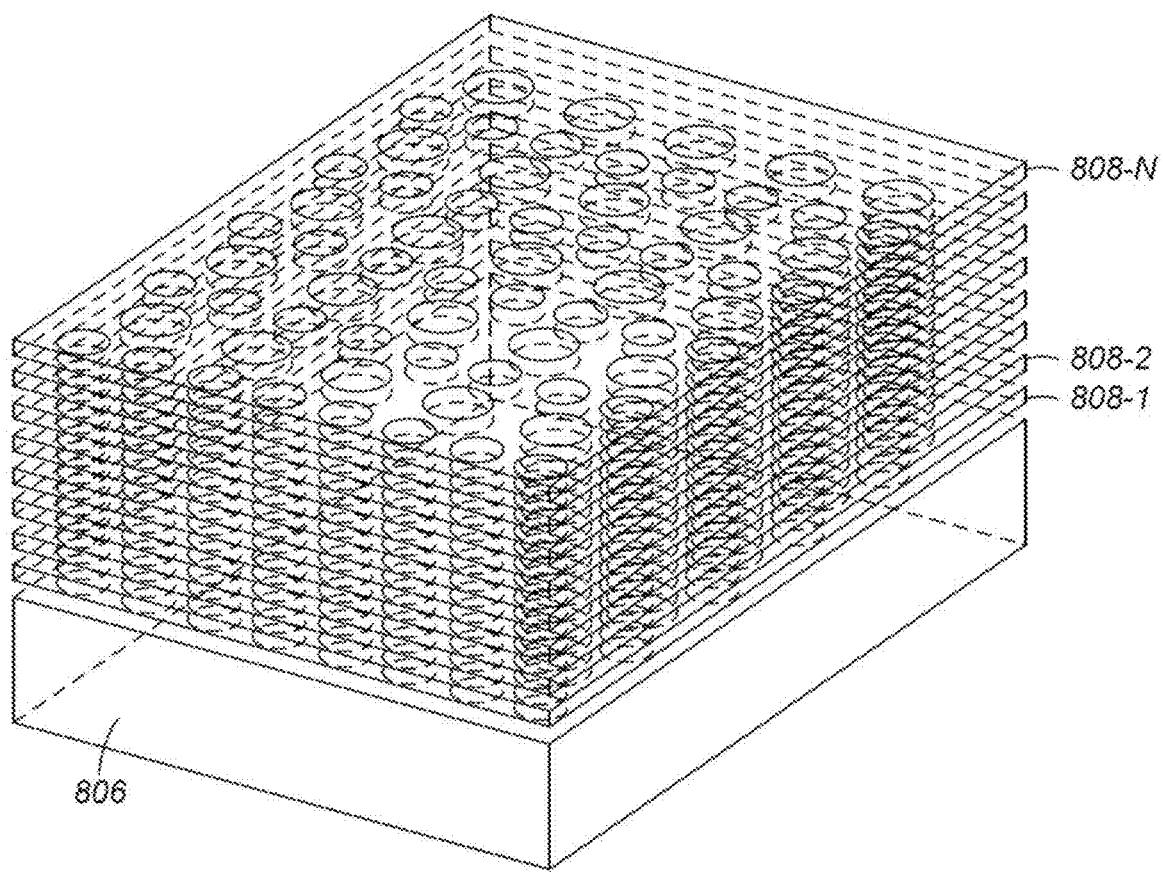
FIG. 9

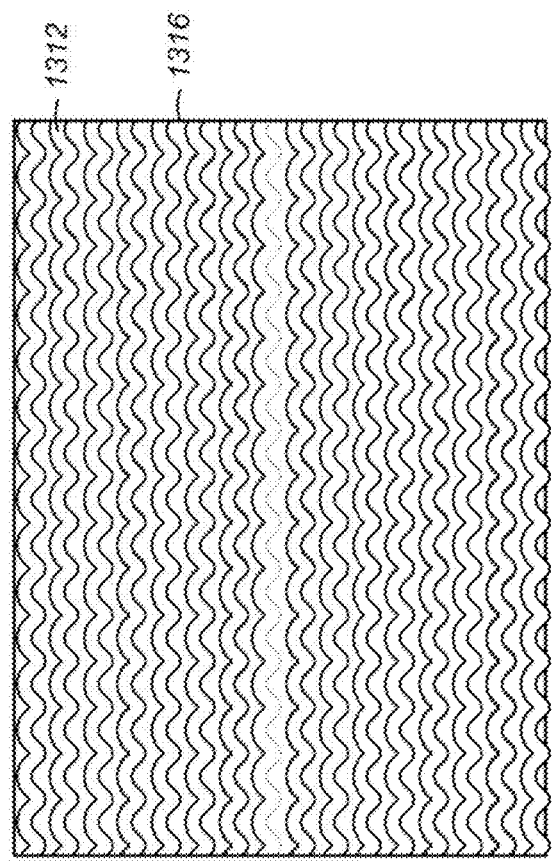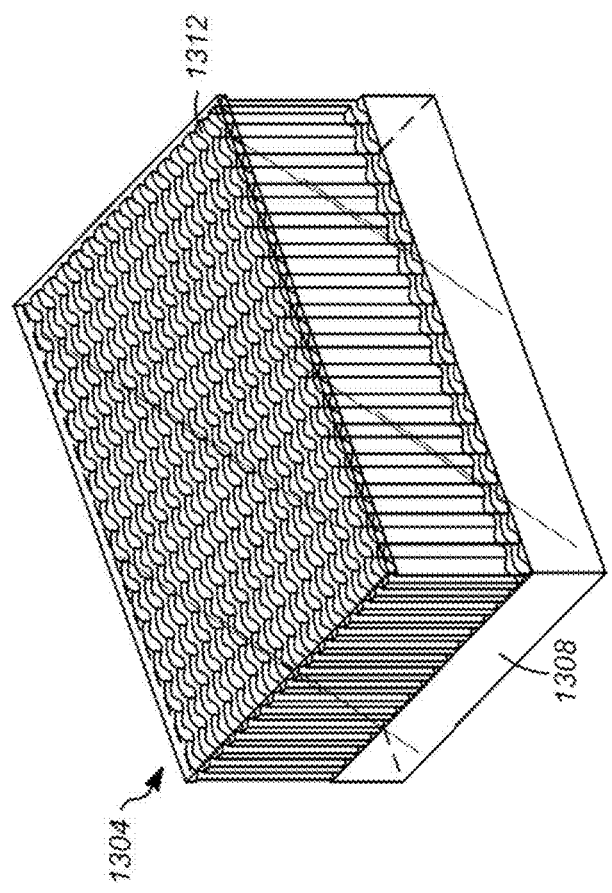
FIG. 13

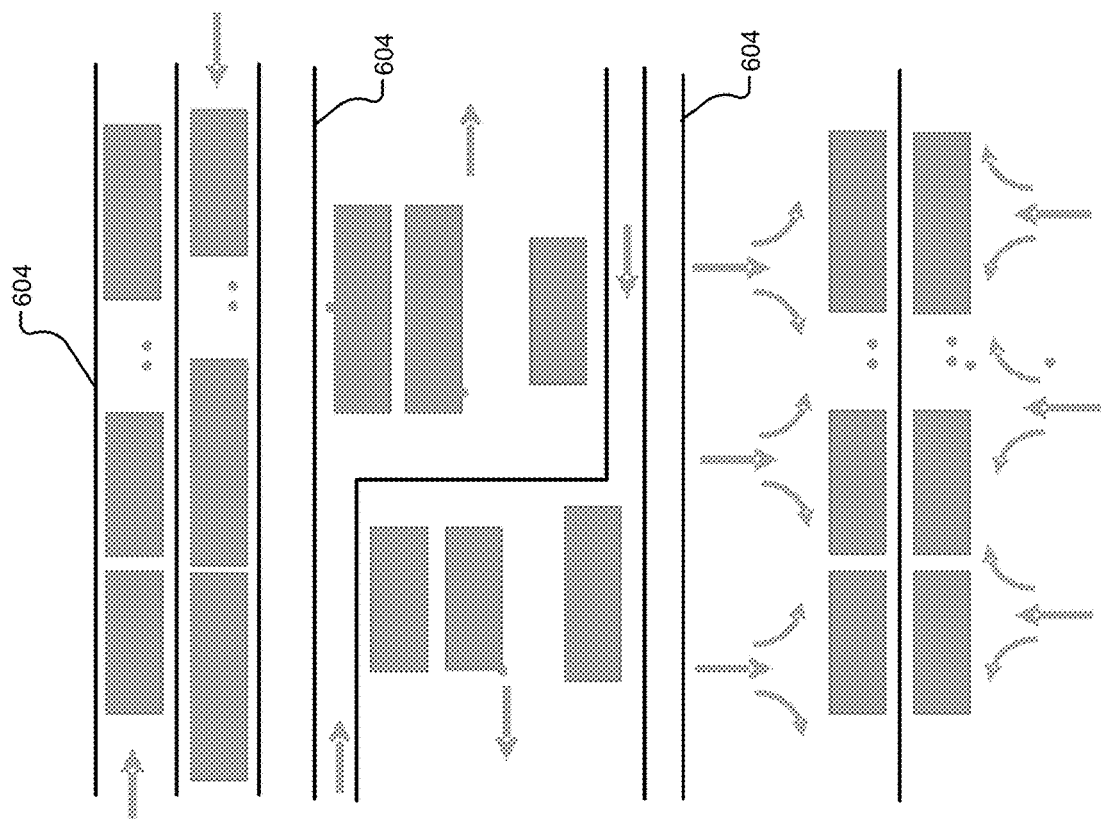
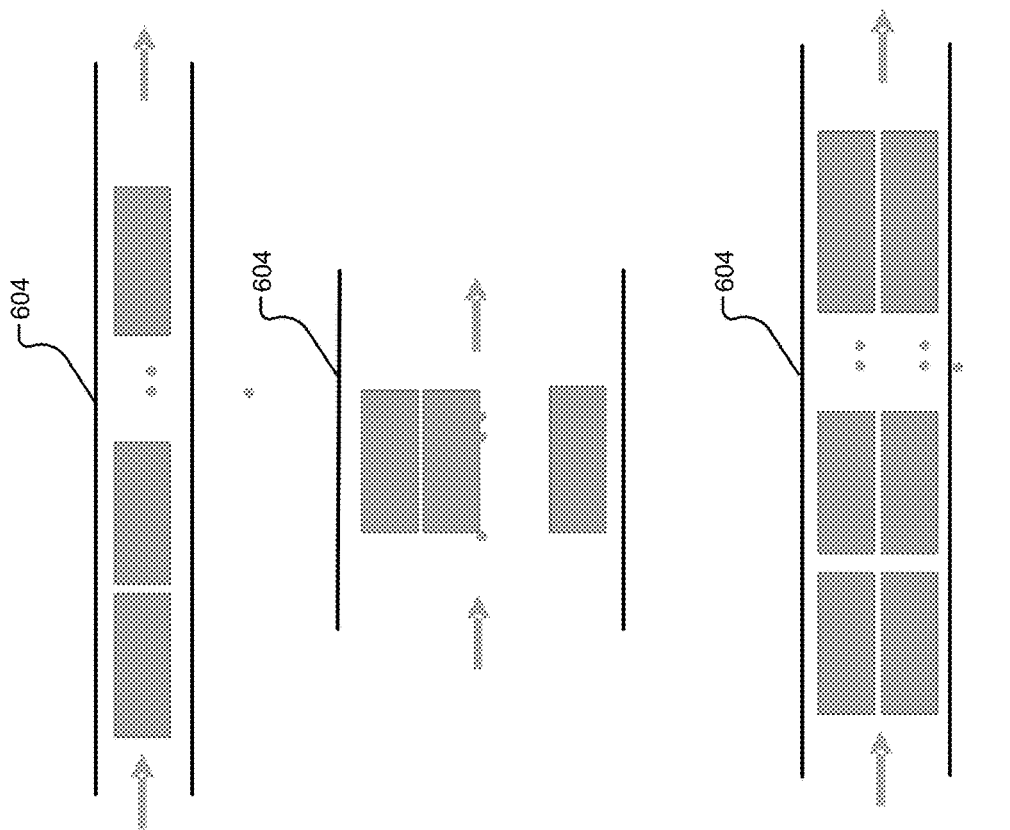
FIG. 14

DIRECT COOLING OF INVERTER SWITCHES

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to vehicle propulsion systems and more particularly to cooling of switches of an inverter module.

Some types of vehicles include only an internal combustion engine that generates propulsion torque. Electric vehicles may not include an internal combustion engine and may rely on one or more electric motors for propulsion.

Hybrid vehicles include both an internal combustion engine and one or more electric motors. Some types of hybrid vehicles utilize the electric motor and the internal combustion engine in an effort to achieve greater fuel efficiency than if only the internal combustion engine was used. Some types of hybrid vehicles utilize the electric motor and the internal combustion engine to achieve greater torque output than the internal combustion could achieve by itself.

Some example types of hybrid vehicles include parallel hybrid vehicles, series hybrid vehicles, and other types of hybrid vehicles. In a parallel hybrid vehicle, the electric motor works in parallel with the engine to combine power and range advantages of the engine with efficiency and regenerative braking advantages of electric motors. In a series hybrid vehicle, the engine drives a generator to produce electricity for the electric motor, and the electric motor drives a transmission. This allows the electric motor to assume some of the power responsibilities of the engine, which may permit the use of a smaller and possibly more efficient engine.

SUMMARY

In a feature, a switch cooling system includes: a coolant channel; a switch of an inverter module that is disposed in the coolant channel, that is configured to be immersed in coolant in the coolant channel, and that includes: a first terminal disposed on a first plane and configured to connect to a direct current (DC) reference potential; a second terminal disposed on a second plane and configured to connect to an alternating current (AC) reference potential; a gate, an emitter, and a collector; first cooling features that extend away from the first and second planes, that directly contact the first terminal, and that are configured to allow coolant flow therethrough; and second cooling features that extend away from the first cooling features, the first plane, and the second plane, that directly contact the second terminal, and that are configured to allow coolant flow therethrough.

In further features, the first and second planes are parallel.

In further features, the first cooling features extend perpendicularly away from the first and second planes.

In further features, the second cooling features extend perpendicularly away from the first and second planes.

In further features a second switch of the inverter module is disposed in the coolant channel, is configured to be immersed in the coolant in the coolant channel, and includes: a third terminal disposed on a third plane and configured to connect to a second DC reference potential; a second gate, a second emitter, and a second collector that are disposed between the second and third planes; and third cooling features that extend away from the second and third planes, that directly contact the third terminal, and that are configured to allow coolant flow therethrough.

In further features, an electrical insulator is disposed between (a) the gate, the emitter, and the collector and (b) the second gate, the second emitter, and the second collector.

In further features, first, second, and third electrical conductors are electrically connected to the first, second, and third terminals and extend through the coolant channel to outside of the coolant channel.

In further features, the first cooling features include members that extend perpendicularly to the first and second planes.

In further features, the first features include: a plurality of parallel plates; and posts that are separate the plates from each other.

In further features, the posts extend perpendicularly to the parallel plates.

In further features, the posts are cylindrical.

In further features, the posts all have the same diameter.

In further features, the posts all have the same pitch.

In further features, the posts include first posts having a first diameter and second posts having a second diameter.

In further features, the first posts have a first pitch and the second posts have a second pitch, wherein the first pitch is different than the second pitch.

In further features, the first cooling features include: a first layer including an inlet, an outlet, a first portion that is fluidly connected to the inlet, and a second portion that is fluidly connected to the outlet; a second layer including a third portion that is fluidly connected to the first and second portions of the first layer; and a third layer including a fourth portion that is fluidly connected to the first and second portions.

In further features, the first cooling features: two parallel plates; and a helical member having a first direction of rotation and disposed between the two parallel plates.

In further features, the first cooling features further include: a second helical member having a second direction of rotation and disposed between the two parallel plates.

In further features, the second direction of rotation is different than the first direction of rotation.

In further features, the first cooling features include: a first material having uniform openings configured to allow coolant flow therethrough; and a second material having non-uniform openings configured to allow coolant flow therethrough.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 8 and 9 are perspective views of example cooling features and a bottom view of an example plate of a cooling feature;

FIGS. 10-14 are perspective views of example cooling features; and

In the drawings, reference numbers may be reused to identify similar and/or identical elements. Dimensions of features of the drawings may not be to scale.

DETAILED DESCRIPTION

An internal combustion engine of a vehicle combusts air and fuel within cylinders to generate propulsion torque. The engine may output torque to wheels of the vehicle via a transmission. Some types of vehicles may not include an internal combustion engine or the internal combustion engine may not be mechanically coupled to a driveline of the vehicle.

An electric motor may be mechanically coupled to a shaft of the transmission. Under some circumstances, a control module of the vehicle may apply power to the electric motor from a battery to cause the electric motor to output torque for vehicle propulsion. Under other circumstances, the control module may disable power flow to the electric motor and allow the transmission to drive rotation of the electric motor. The electric motor generates power when driven by the transmission. Power generated by the electric motor can be used to recharge the battery when a voltage generated via the electric motor is greater than a voltage of the battery. The control module switches one or more switches of an inverter module to apply power to the electric motor from the battery.

The switches (e.g., the terminals) get relatively hot during switching. According to the present disclosure, the switches are immersed in a cooling fluid (e.g., a dielectric fluid) to cool the switches. The switches include cooling features that contact the terminals to increase heat transfer away from the terminals and the switches.

Figure 1:
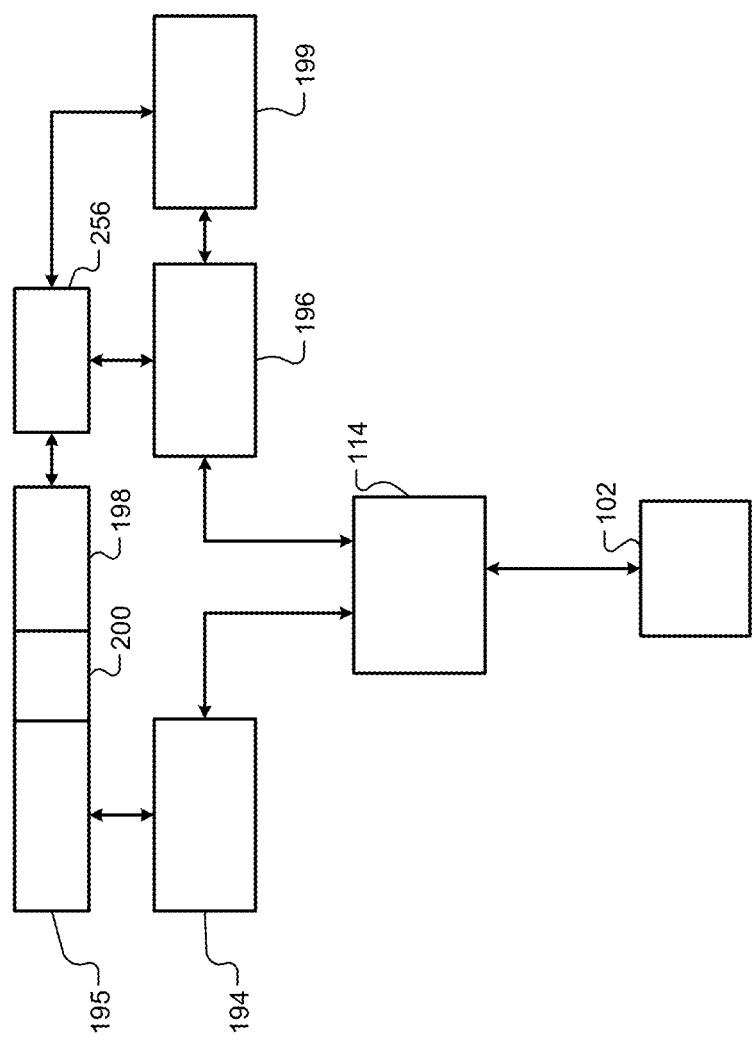
FIG. 1 is a functional block diagram of an example vehicle system.

Referring now to FIG. 1, a functional block diagram of an example vehicle system is presented. While a vehicle system for a hybrid vehicle is shown and will be described, the present disclosure is also applicable to electric vehicles that do not include an internal combustion engine, fuel cell vehicles, autonomous vehicles, and other types of vehicles. Also, while the example of a vehicle is provided, the present application is also applicable to non-vehicle implementations including one or more switches.

An engine 102 may combust an air/fuel mixture to generate drive torque. An engine control module (ECM) 114 controls the engine 102. For example, the ECM 114 may control actuation of engine actuators, such as a throttle valve, one or more spark plugs, one or more fuel injectors, valve actuators, camshaft phasers, an exhaust gas recirculation (EGR) valve, one or more boost devices, and other suitable engine actuators. In some types of vehicles (e.g., electric vehicles), the engine 102 may be omitted.

The engine 102 may output torque to a transmission 195. A transmission control module (TCM) 194 controls operation of the transmission 195. For example, the TCM 194 may control gear selection within the transmission 195 and one or more torque transfer devices (e.g., a torque converter, one or more clutches, etc.).

The vehicle system includes one or more electric motors, such as electric motor 198. An electric motor can act as either a generator or as a motor at a given time. When acting as a generator, an electric motor converts mechanical energy into electrical energy. The electrical energy can be, for example, used to charge a battery 199. When acting as a motor, an electric motor generates torque that may be used, for example, for vehicle propulsion. While the example of one electric motor is provided, the vehicle may include more than one electric motor.

A motor control module 196 controls power flow from the battery 199 to the electric motor 198 and from the electric motor 198 to the battery 199. The motor control module 196 applies electrical power from the battery 199 to the electric motor 198 to cause the electric motor 198 to output positive torque, such as for vehicle propulsion. The battery 199 may include, for example, one or more batteries and/or battery packs.

The electric motor 198 may output torque, for example, to an input shaft of the transmission 195 or to an output shaft of the transmission 195. A clutch 200 may be engaged to couple the electric motor 198 to the transmission 195 and disengaged to decouple the electric motor 198 from the transmission 195. One or more gearing devices may be implemented between an output of the clutch 200 and an input of the transmission 195 to provide a predetermined ratio between rotation of the electric motor 198 and rotation of the input of the transmission 195.

The motor control module 196 may also selectively convert mechanical energy of the vehicle into electrical energy. More specifically, the electric motor 198 generates and outputs power via back EMF when the electric motor 198 is being driven by the transmission 195 and the motor control module 196 is not applying power to the electric motor 198 from the battery 199. The motor control module 196 may charge the battery 199 via the power output by the electric motor 198.

Figure 2:
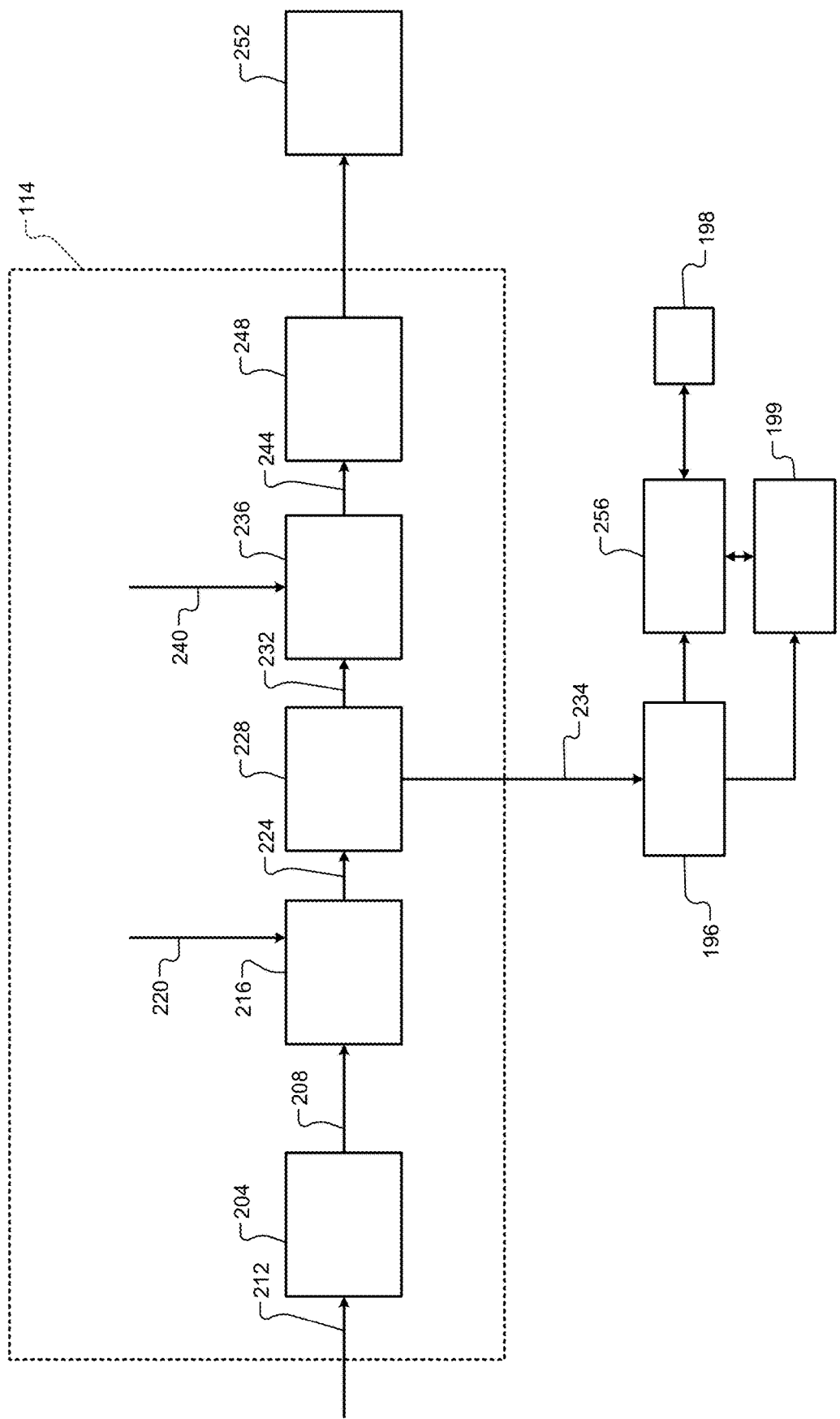
FIG. 2 is a functional block diagram of an example propulsion control system.

Referring now to FIG. 2, a functional block diagram of an example propulsion control system is presented. A driver torque module 204 determines a driver torque request 208 based on driver input 212. The driver input 212 may include, for example, an accelerator pedal position (APP), a brake pedal position (BPP), cruise control input, and/or an autonomous input. In various implementations, the cruise control input may be provided by an adaptive cruise control system that attempts to maintain at least a predetermined distance between the vehicle and objects in a path of the vehicle. The autonomous input may be provided by an autonomous driving system that controls movement of a vehicle from location to location while avoiding objects and other vehicles. The driver torque module 204 determines the driver torque request 208 based on one or more lookup tables that relate the driver inputs to driver torque requests. The APP and BPP may be measured using one or more APP sensors and BPP sensors, respectively.

The driver torque request 208 may be an axle torque request. Axle torques (including axle torque requests) refer to torque at the wheels. As discussed further below, propulsion torques (including propulsion torque requests) are different than axle torques in that propulsion torques may refer to torque at a transmission input shaft.

An axle torque arbitration module 216 arbitrates between the driver torque request 208 and other axle torque requests 220. Axle torque (torque at the wheels) may be produced by various sources including the engine 102 and/or one or more electric motors, such as the electric motor 198. Examples of the other axle torque requests 220 include, but are not limited to, a torque reduction requested by a traction control system when positive wheel slip is detected, a torque increase request to counteract negative wheel slip, brake management requests to reduce axle torque to ensure that the axle torque does not exceed the ability of the brakes to hold the vehicle when the vehicle is stopped, and vehicle overspeed torque requests to reduce the axle torque to prevent the vehicle from exceeding a predetermined speed. The axle torque arbitration module 216 outputs one or more axle torque requests 224 based on the results of arbitrating between the received axle torque requests 208 and 220.

In hybrid vehicles, a hybrid module 228 may determine how much of the one or more axle torque requests 224 should be produced by the engine 102 and how much of the one or more axle torque requests 224 should be produced by the electric motor 198. The example of the electric motor 198 will be continued for simplicity, but multiple electric motors may be used. The hybrid module 228 outputs one or more engine torque requests 232 to a propulsion torque arbitration module 236. The engine torque requests 232 indicate a requested torque output of the engine 102.

The hybrid module 228 also outputs a motor torque request 234 to the motor control module 196. The motor torque request 234 indicates a requested torque output (positive or negative) of the electric motor 198. In vehicles where the engine 102 is omitted (e.g., electric vehicles) or is not connected to output propulsion torque for the vehicle, the axle torque arbitration module 216 may output one axle torque request and the motor torque request 234 may be equal to that axle torque request. In the example of an electric vehicle, the ECM 114 may be omitted, and the driver torque module 204 and the axle torque arbitration module 216 may be implemented within the motor control module 196.

In electric vehicles, the driver torque module 204 may input the driver torque request 208 to the motor control module 196 and the components related to controlling engine actuators may be omitted.

The propulsion torque arbitration module 236 converts the engine torque requests 232 from an axle torque domain (torque at the wheels) into a propulsion torque domain (e.g., torque at an input shaft of the transmission). The propulsion torque arbitration module 236 arbitrates the converted torque requests with other propulsion torque requests 240. Examples of the other propulsion torque requests 240 include, but are not limited to, torque reductions requested for engine over-speed protection and torque increases requested for stall prevention. The propulsion torque arbitration module 236 may output one or more propulsion torque requests 244 as a result of the arbitration.

An actuator control module 248 controls actuators 252 of the engine 102 based on the propulsion torque requests 244. For example, based on the propulsion torque requests 244, the actuator control module 248 may control opening of a throttle valve, timing of spark provided by spark plugs, timing and amount of fuel injected by fuel injectors, cylinder actuation/deactivation, intake and exhaust valve phasing, output of one or more boost devices (e.g., turbochargers, superchargers, etc.), opening of an EGR valve, and/or one or more other engine actuators. In various implementations, the propulsion torque requests 244 may be adjusted or modified before use by the actuator control module 248, such as to create a torque reserve.

The motor control module 196 controls switching of switches of an inverter module 256 based on the motor torque request 234. Switching of the inverter module 256 controls power flow from the battery 199 to the electric motor 198. As such, switching of the inverter module 256 controls torque of the electric motor 198. The inverter module 256 also converts power generated by the electric motor 198 and outputs power to the battery 199, for example, to charge the battery 199.

The inverter module 256 includes a plurality of switches. The motor control module 196 switches the switches to convert DC power from the battery 199 into alternating current (AC) power and to apply the AC power to the electric motor 198 to drive the electric motor 198. For example, the inverter module 256 may convert the DC power from the battery 199 into n-phase AC power and apply the n-phase AC power to (e.g., a, b, and c, or u, v, and w) n stator windings of the electric motor 198. In various implementations, n is equal to 3. Magnetic flux produced via current flow through the stator windings drives a rotor of the electric motor 198. The rotor is connected to and drives rotation of an output shaft of the electric motor 198.

In various implementations, one or more filters may be electrically connected between the inverter module 256 and the battery 199. The one or more filters may be implemented, for example, to filter power flow to and from the battery 199. As an example, a filter including one or more capacitors and resistors may be electrically connected in parallel with the inverter module 256 and the battery 199.

Figure 3:
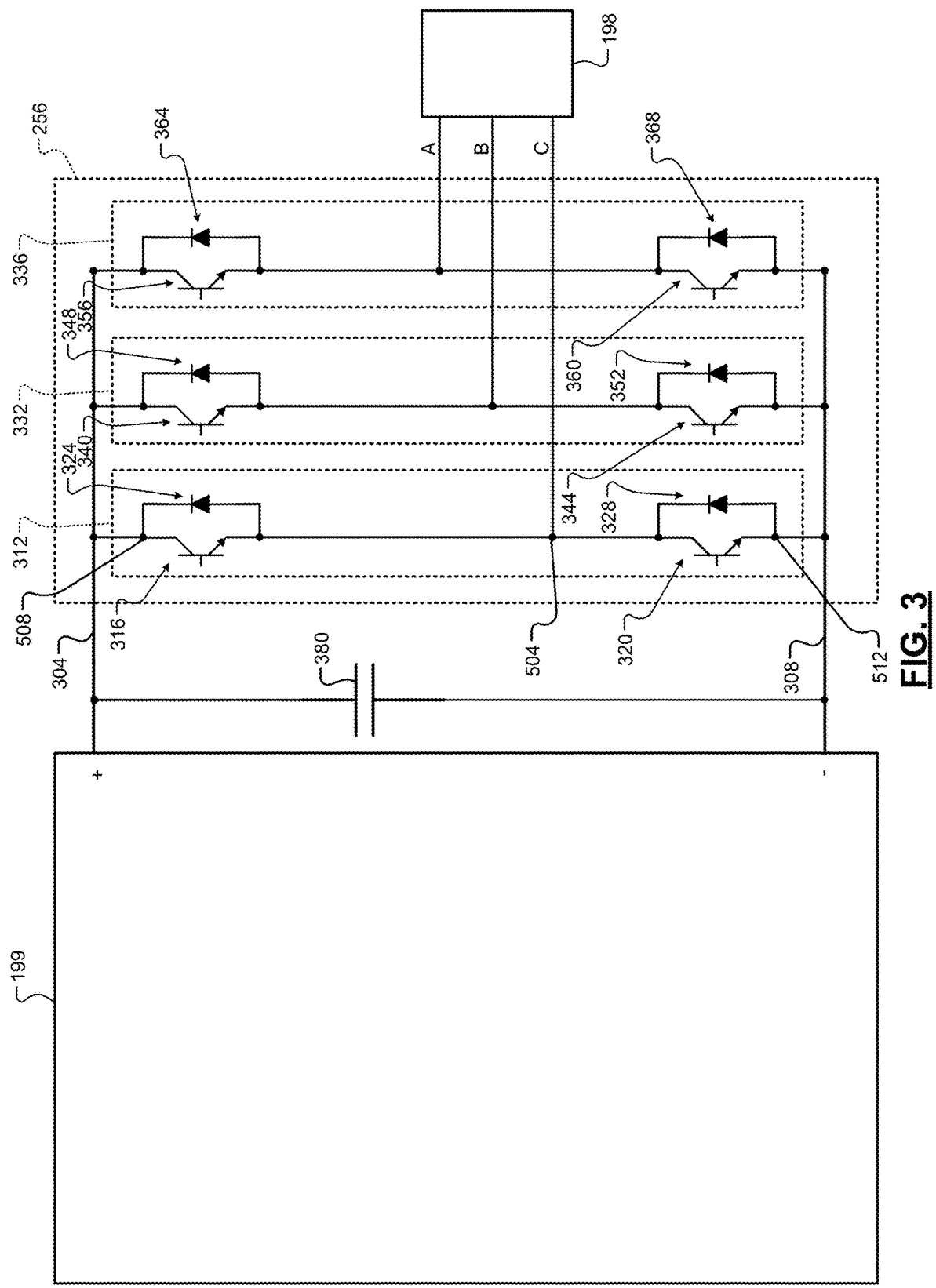
FIG. 3 is a schematic including an example implementation of an inverter module and a battery.

FIG. 3 includes a schematic including an example implementation of the inverter module 256 and the battery 199. High (positive, DC+) and low (negative, DC−) sides 304 and 308 are connected to positive and negative terminals, respectively, of the battery 199. The inverter module 256 is also connected between the high and low sides 304 and 308.

The inverter module 256 includes three legs, one leg connected to each phase of the electric motor 198. A first leg 312 includes first and second switches 316 and 320. The switches 316 and 320 each include a first terminal, a second terminal, and a control terminal. Each of the switches 316 and 320 may be an insulated gate bipolar transistor (IGBT), a field effect transistor (FET), such as a metal oxide semiconductor FET (MOSFET), or another suitable type of switch. In the example of IGBTs and FETs, the control terminal is referred to as a gate.

The first terminal of the first switch 316 is connected to the high side 304. The second terminal of the first switch 316 is connected to the first terminal of the second switch 320. The second terminal of the second switch 320 may be connected to the low side 308. A node connected to the second terminal of the first switch 316 and the first terminal of the second switch 320 is connected to a first phase (e.g., a) of the electric motor 198.

The first leg 312 also includes first and second diodes 324 and 328 connected anti-parallel to the switches 316 and 320, respectively. In other words, an anode of the first diode 324 is connected to the second terminal of the first switch 316, and a cathode of the first diode 324 is connected to the first terminal of the first switch 316. An anode of the second diode 328 is connected to the second terminal of the second switch 320, and a cathode of the second diode 328 is connected to the first terminal of the second switch 320. When the switches 316 and 320 are off (and open), power generated by the electric motor 198 is transferred through the diodes 324 and 328 when the output voltage of the electric motor 198 is greater than the voltage of the battery 199. This charges the battery 199. The diodes 324 and 328 form one phase of a three-phase rectifier.

The inverter module 256 also includes second and third legs 332 and 336. The second and third legs 332 and 336 may be (circuitry wise) similar or identical to the first leg 312. In other words, the second and third legs 332 and 336 may each include respective switches and diodes like the switches 316 and 320 and the diodes 324 and 328, connected in the same manner as the first leg 312. For example, the second leg 332 includes switches 340 and 344 and anti-parallel diodes 348 and 352. A node connected to the second terminal of the switch 340 and the first terminal of the switch 344 is connected to a second stator winding (e.g., b) of the electric motor 198. The third leg 336 includes switches 356 and 360 and anti-parallel diodes 364 and 368. A node connected to the second terminal of the switch 356 and the first terminal of the switch 360 is connected to a third stator winding (e.g., c) of the electric motor 198.

Figure 4:
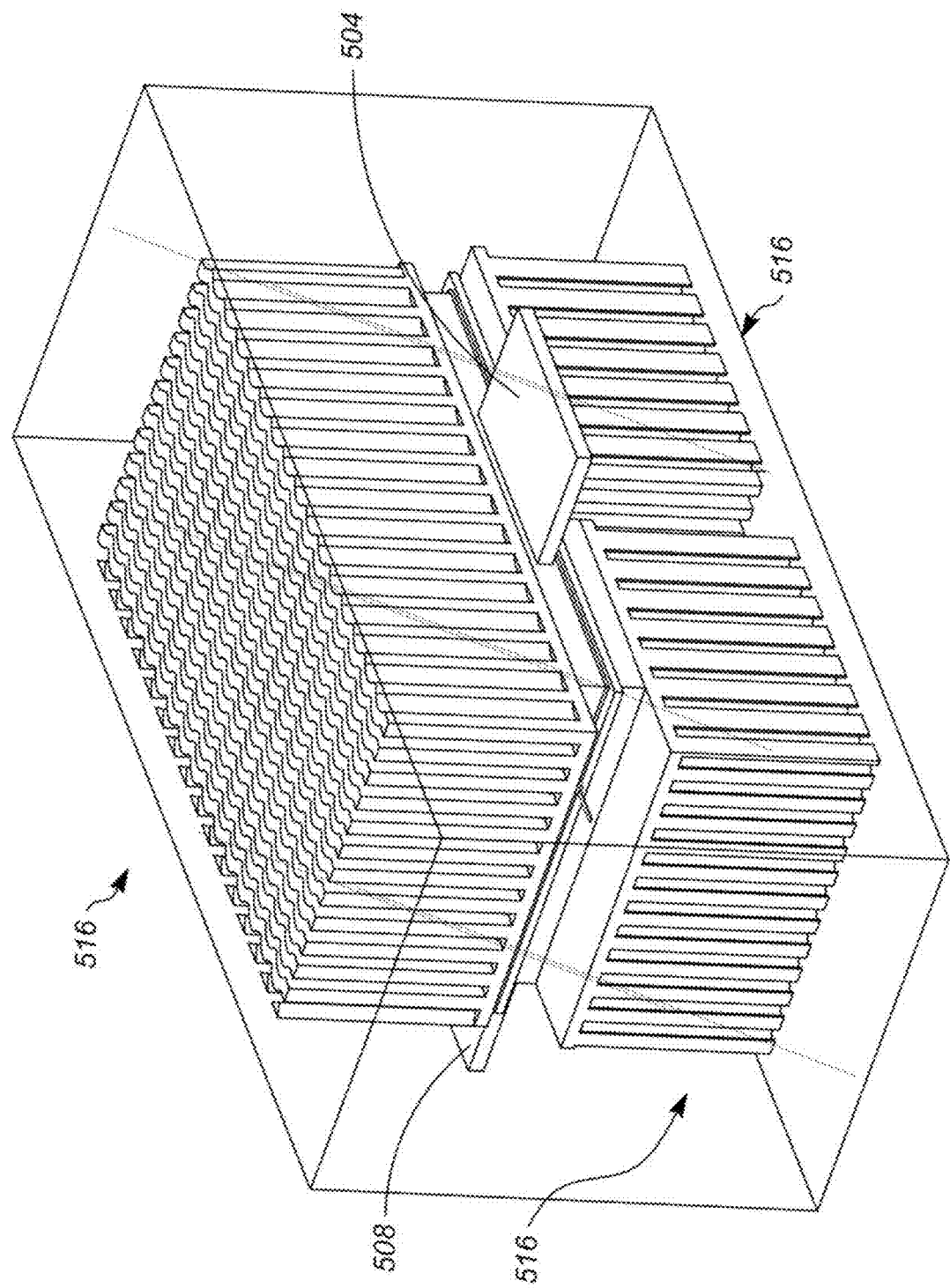
FIG. 4 is a perspective view of an example implementation of switches of a leg of the inverter module.
Figure 5:
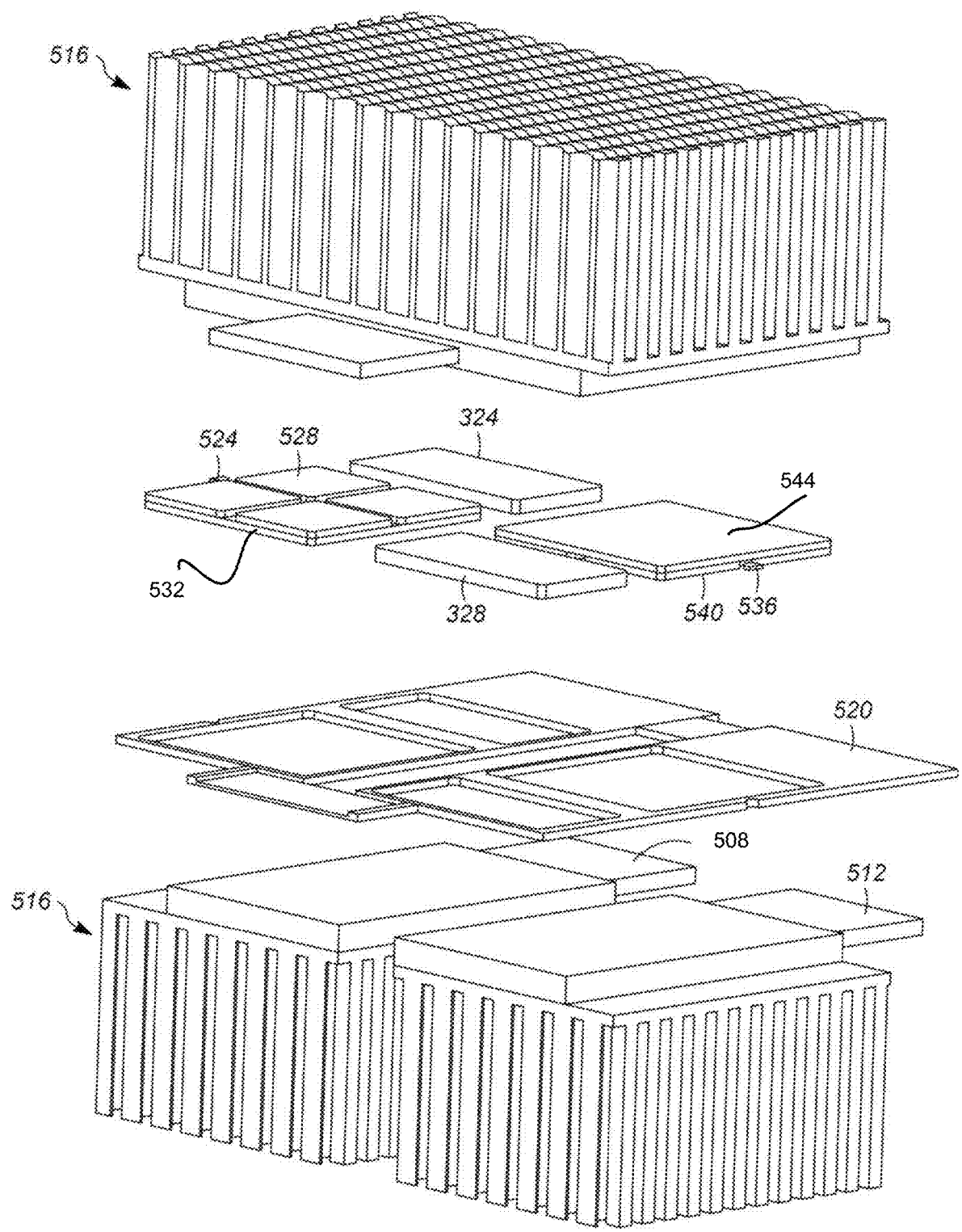
FIG. 5 is an exploded perspective view of the example switches of the leg of FIG. 4.

FIG. 4 is an example perspective view of the switches of the first leg 312 of the inverter module 256. FIG. 5 is an exploded perspective view of the switches of the first leg 312. The switches of the second and third legs 332 and 336 may be identical to the switches of the first leg 312.

An AC terminal 504 is connected to a phase of the electric motor 198. A positive DC terminal 508 is connected to the high side 304. A negative DC terminal 512 is connected to the low side 308. The AC terminal 504, the positive DC terminal 508, and the negative DC terminal 512 each include cooling features 516 that extend vertically away from the switches, and coolant flows through the cooling features 516 to cool the switches of the first leg 312. While the positive and negative DC terminals 508 and 512 are illustrated relatively close to each other, the positive and negative DC terminals 508 and 512 are separated and electrically isolated from each other. In various implementations, an (electrical) insulator may be disposed between the positive and negative DC terminals 508 and 512. The AC terminal 504, the positive DC terminal 508, and the negative DC terminal 512 are made of an electrically conductive material, such as aluminum, copper, or another suitable type of electrically conductive material.

The diodes 324 and 328 are shown in the example of FIG. 5. An insulator 520 is disposed between the first switch 316 and the second switch 320 and electrically isolates the first switch 316 from the second switch 320. The first switch 316 includes a gate 524, an emitter 528, and a collector 532. The second switch 320 includes a gate 536, an emitter 540, and a collector 544. As illustrated, the emitters 528 and 540 may include multiple emitter portions. The first and second switches 316 and 320 may be silicon switches, silicon carbide (SiC) switches, gallium nitride (GaN) switches, or another suitable type of switch.

Figure 6:
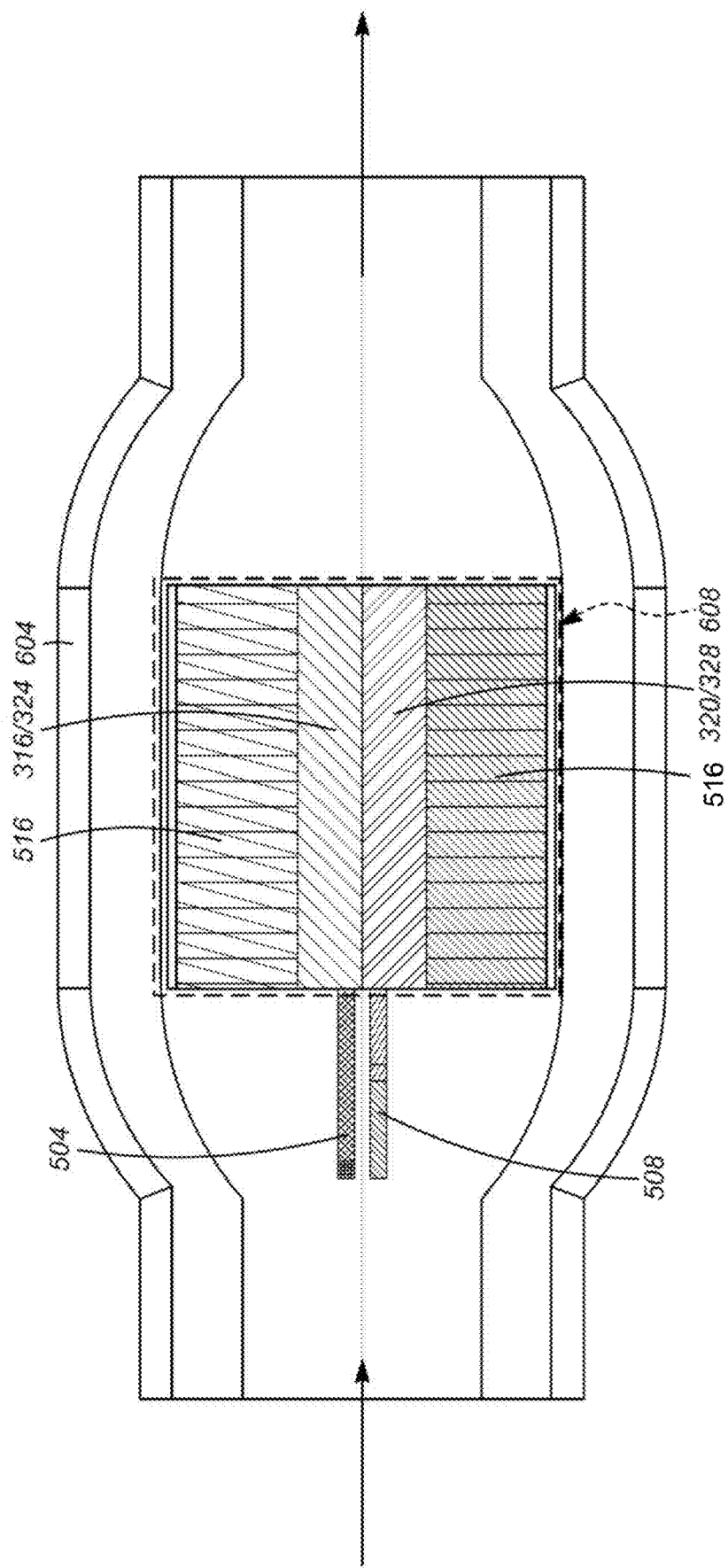
FIG. 6 is a cross-sectional side view of an example implementation of a coolant channel and the switches of the leg.
Figure 7:
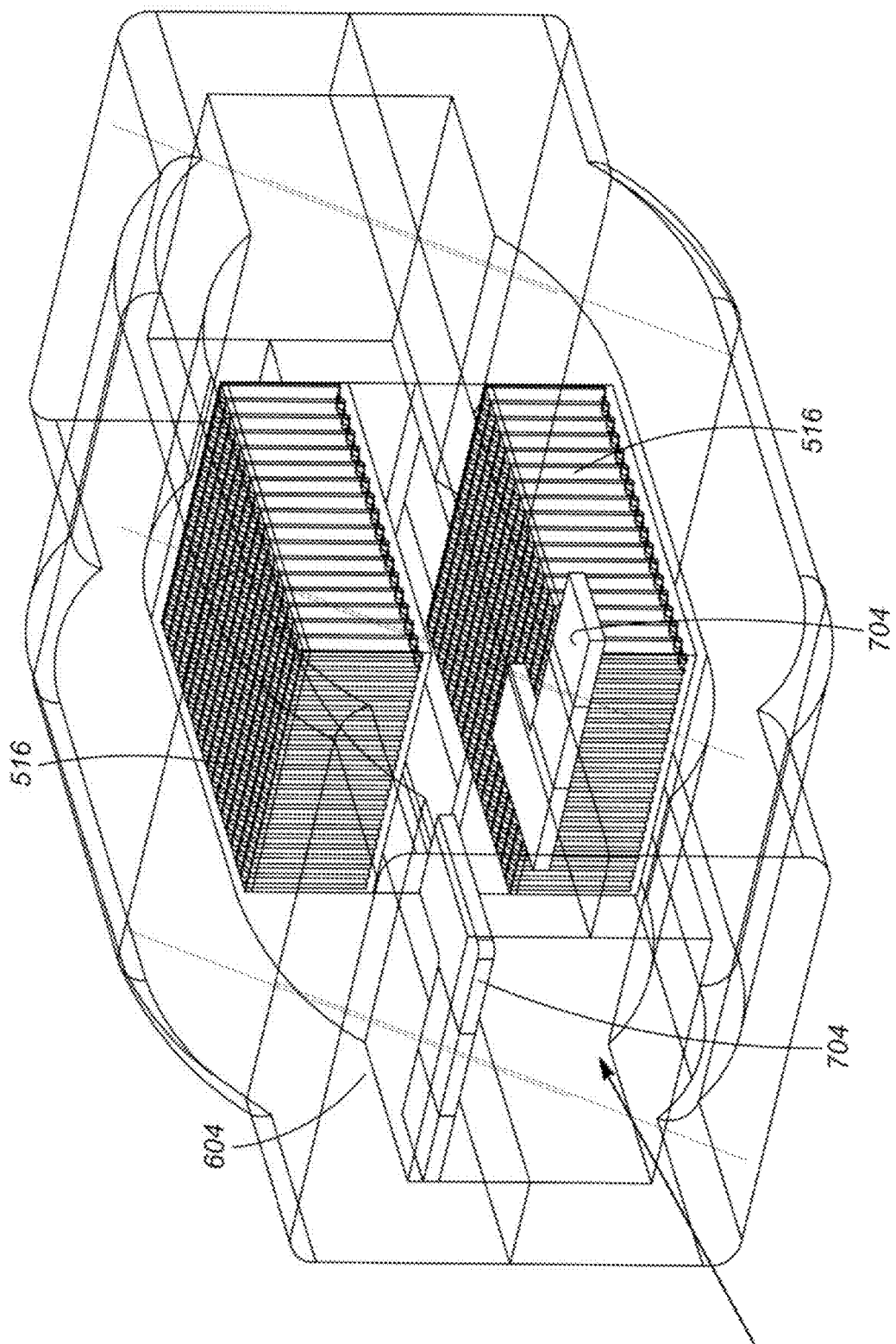
FIG. 7 is a three-dimensional perspective view of the example coolant channel and the switches of the leg of FIG. 6.

FIG. 6 includes a cross-sectional side view of a coolant channel 604 and the switches of the first leg 312. FIG. 7 includes a three-dimensional perspective view of the coolant channel 604 and the switches of the first leg 312. As shown, a package 608 including the switches of the first leg 312 is disposed within the coolant channel 604. One or more spacers 612 may be implemented on an exterior of the package and contact inner walls of the coolant channel 604. Coolant flows through the coolant channel 604 and the cooling features 516 of the AC, positive DC, and negative DC terminals 504, 508, and 512.

As shown in FIG. 5, the switches may be disposed on planes. For example, the first switch 316 and the first diode 324 may be disposed on a first plane, and the second switch 320 and the second diode 328 may be disposed on a second plane. The first and second planes may be parallel. The cooling features 516 of the AC, positive DC, and negative DC terminals 504, 508, and 512 may each extend perpendicularly to (normal to) the first and second planes. As shown in FIGS. 6 and 7, leads 704 connecting to the AC, positive DC, and negative DC terminals 504, 508, and 512 may extend through the coolant channel 604 as to be electrically connected to other components outside of the coolant channel 604.

FIG. 8 is a perspective view of example features 804 of the negative DC terminal 512 and a bottom view of example plate 808. The cooling features of the AC terminal 504 and the positive DC terminal 508 may be identical to the cooling features 804.

A first plate 806 is electrically conductive and may contact one or more portions of one or more of the switches. The plate 806 is disposed on a plane that is horizontal to the planes of the switches.

The cooling features 804 include a plurality of plates, such as plates 808-1, 808-2, . . . 808-N (collectively referred to as plates 808). The plates 808 are disposed on different horizontal planes that are parallel to the planes of the switches and parallel to the plane of the plate 806.

Posts 812 are formed on and extend away from a bottom surface 816 of each of the plates 808. The plates 808 and the posts 812 may be made of an electrically conductive material. The posts 812 of the plates 808 may extend perpendicularly to the plates 808. The posts 812 may be cylindrical, such as in the example of FIG. 8. While the example of cylindrical posts is provided, the posts 812 may have another suitable shape. The posts 812 may have the same diameter, spacing, and pitch such as in the example of FIG. 8. In various implementations, posts of two or more different diameters may be used, and two or more different post spacings and/or pitches may be used. For example, FIG. 9 includes a perspective view of example features 804 of the negative DC terminal 512 and a bottom view of example plate 808. In the example of FIG. 9, each of the plates 808 includes first posts 904 of a first diameter and second posts 908 of a second diameter. A first distance is present between centers of the first posts 904, and a second distance that is different than the first distance is present between centers of the second posts 908.

In the examples of FIGS. 8 and 9, coolant can flow between the plates and between the posts to cool the switches.

In various implementations, the plates 804 and 808 may be replaced with features that are configured to move through multiple different planes that are parallel to the switches.

Figure 10:
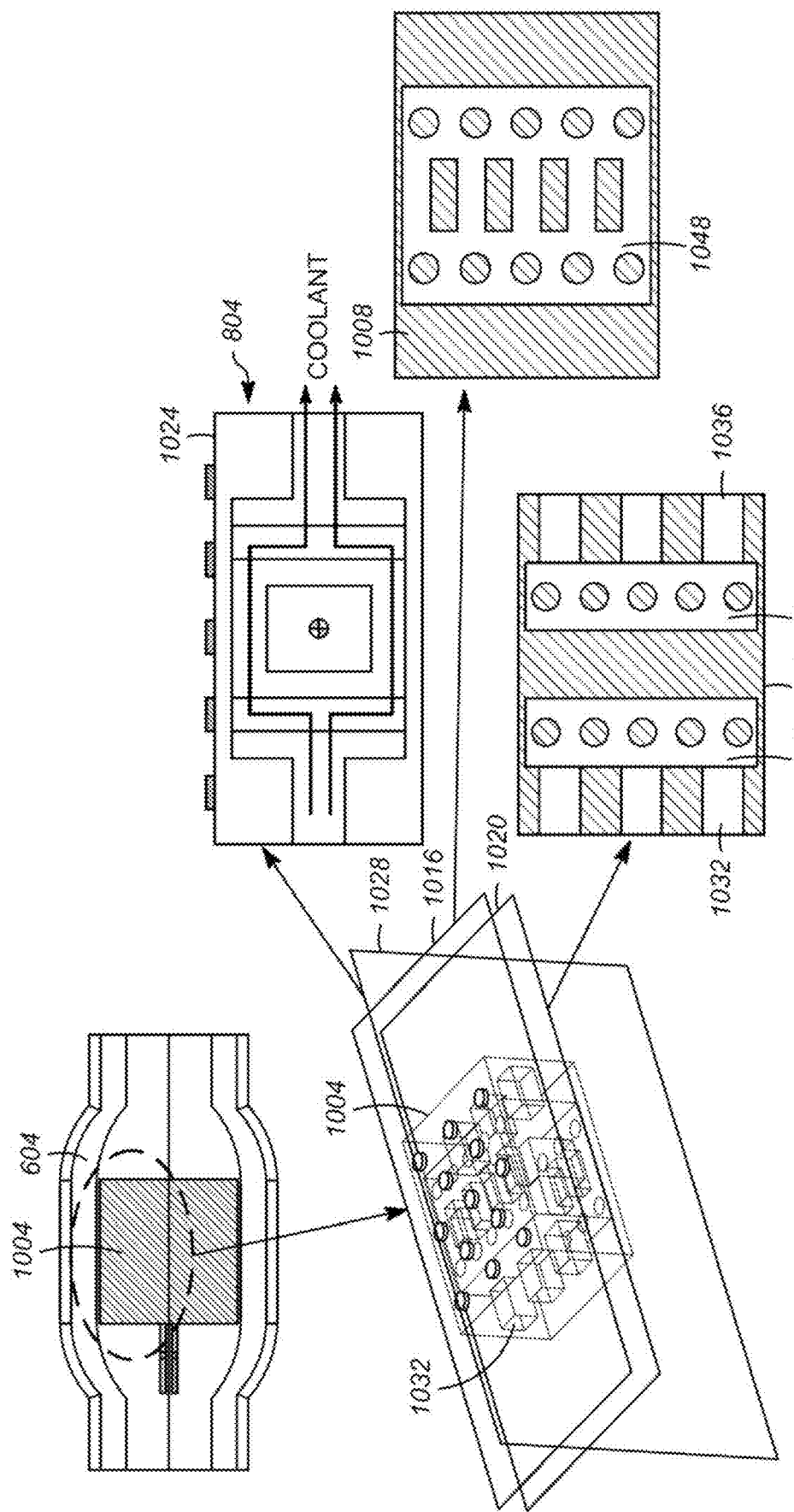

For example, FIG. 10 is a perspective view of an example cooling feature 1004 of the negative DC terminal 512. The cooling features of the AC terminal 504 and the positive DC terminal 508 may be identical to the feature 804.

The feature 1004 includes at least three layers disposed on different planes that are parallel to the planes of the switches. While the example of FIG. 10 involves a three layer example, two or more layers may be used.

FIG. 10 also includes views of example top and bottom layers 1008 and an example middle layer 1012. The middle layer 1012 is disposed between the top and bottom layers 1008, such as on plane 1016. The top and bottom layers 1008 are disposed above and below the middle layer 1012. For example, the top layer 1008 may be disposed on plane 1020. The top and bottom layers 108 may be identical. Cross-section 1024 is taken along plane 1028.

The middle layer 1012 may include inlets 1032 and outlets 1036, a first portion 1040, and a second portion 1044. Coolant flows through the inlets 1032 to the first portion 1040. The top and bottom layers 1008 include a third portion 1048 that receives coolant from the first portion 1040 and that flows coolant to the second portion 1044. The second portion 1044 is fluidly connected to the outlets 1036, and coolant flows out through the outlets 1036. Example coolant flow paths are provided on cross-section 1024.

Figure 11:
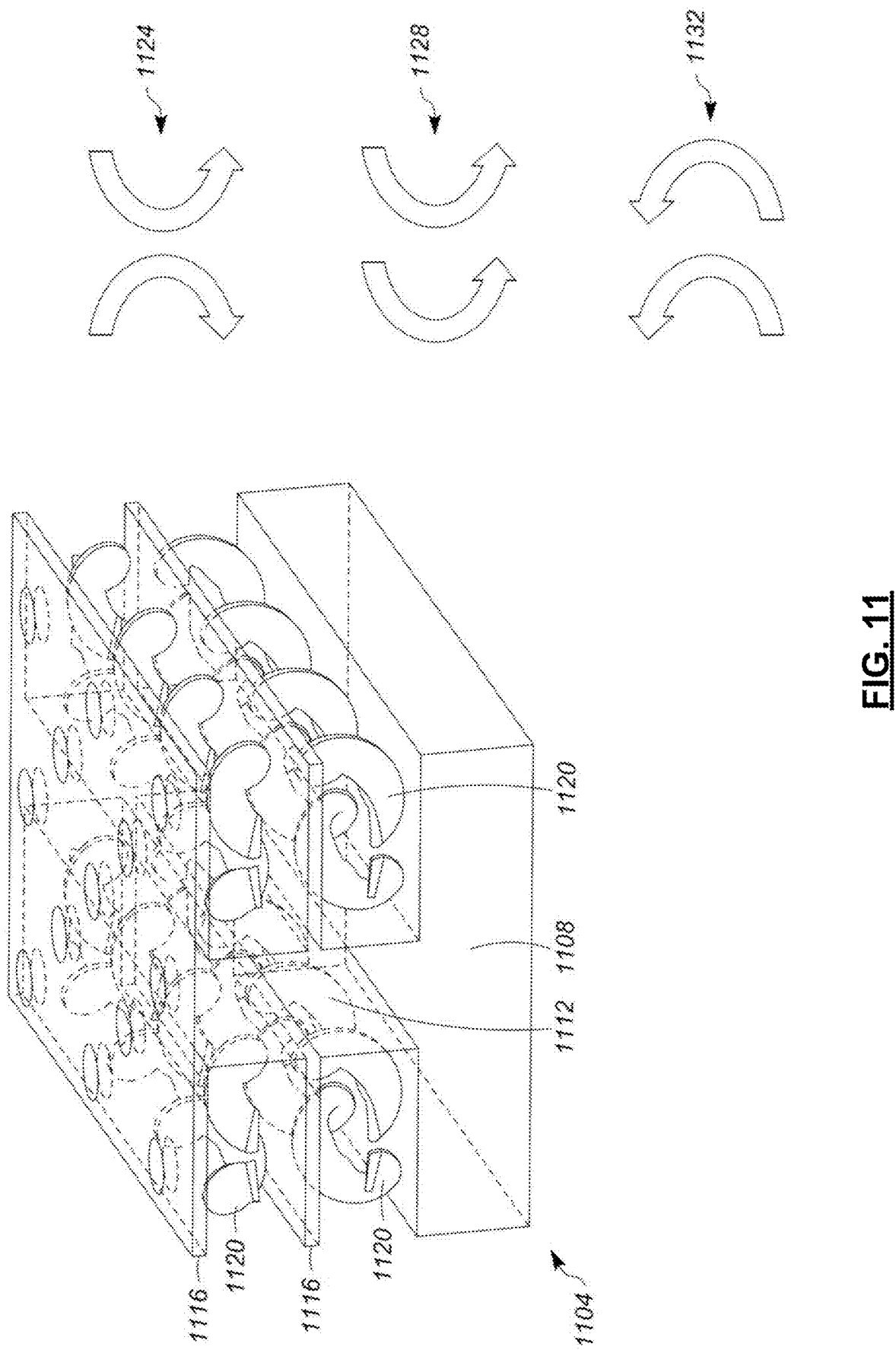

FIG. 11 includes a perspective view of an example cooling feature 1104 of the negative DC terminal 512. The cooling features of the AC terminal 504 and the positive DC terminal 508 may be identical to the feature 1104.

The feature 1104 includes a plate 1108 that is disposed on a plane that is parallel to the planes of the switches. A support 1112 extends away from the plate 1108, such as perpendicular to the plane of the plate 1108. Other plates 1116 extend away from the support 1112, such as perpendicular to the support 1112, such that the plates 1116 and the support 1112 form T shapes. The plates 1116 may be disposed along planes that are parallel to the plane of the plate 1108. Coolant flows through cavities between adjacent ones of the plates 1116.

One or more rotation inducing members 1120 are disposed in the cavities between adjacent ones of the plates 1116. The rotation inducing members 1120 may be helix shaped. For example, as shown in the example of FIG. 11, two rotation inducing members 1120 may be disposed in each cavity. As an example, the two rotation inducing members 1120 may include one right-hand helix and one left-hand helix to provide counter-rotating coolant flow, as illustrated by 1124. Alternatively, the two rotation inducing members 1120 may include two right-hand helixes or two left-handed helixes to provide co-rotating coolant flow as illustrated by 1128 and 1132.

Figure 12:
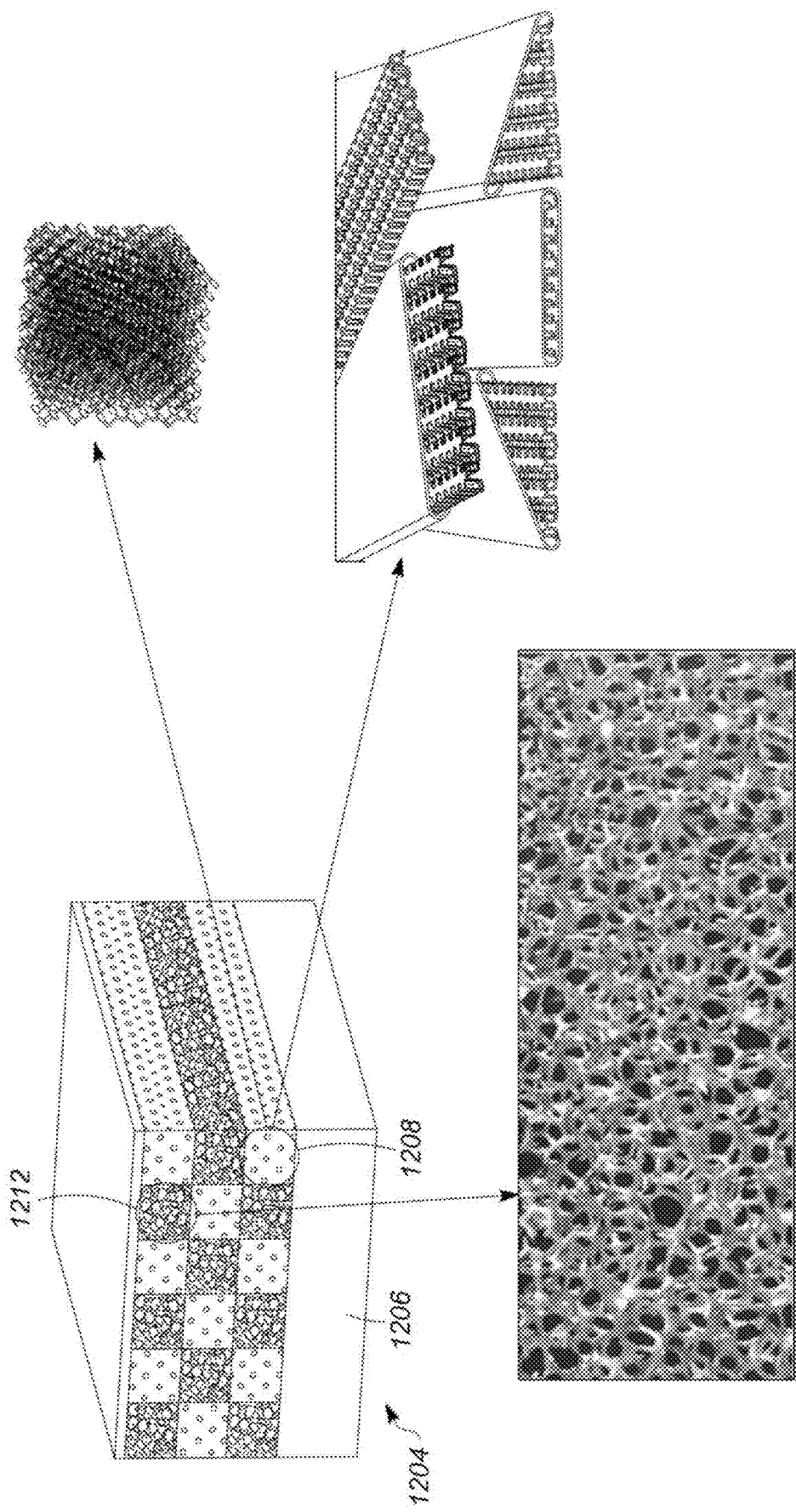

FIG. 12 includes a perspective view of an example cooling feature 1204 of the negative DC terminal 512. The cooling features of the AC terminal 504 and the positive DC terminal 508 may be identical to the feature 1204.

The feature 1204 may include a plate 1206 that is disposed on a plane that is parallel to the planes of the switches. Alternating rectangular blocks of structured material 1208 and unstructured material 1212 may be arranged in rows and columns on the plate 1206. Example illustrations of the structured material 1208 is provided at the right on FIG. 12. The structured material 1208 has the same openings throughout. An example illustration of the unstructured material 1212 is provided at the bottom of FIG. 12. An example of the unstructured material 1212 includes metal foam. Coolant flows through the structured material 1208 and the unstructured material 1212 to cool the switches.

FIG. 13 is a perspective view of example features 1304 of the negative DC terminal 512. FIG. 13 also includes a top view of the example features 1304. The cooling features of the AC terminal 504 and the positive DC terminal 508 may be identical to the cooling features 1304.

A plate 1308 is electrically conductive and may contact one or more portions of one or more of the switches. The plate 1308 is disposed on a plane that is horizontal to the planes of the switches.

Extensions 1312 are formed on and extend away from the plate 1308, such as perpendicular (normal) to the plate 1308. The extensions 1312 may be made of an electrically conductive material. As shown in the top view, when viewed from the top, the extensions 1312 form channels 1316. Coolant flows through the channels 1316 and between adjacent ones of the extensions 1312. The channels 1316 and the extensions 1312 may be wave shaped when viewed from the top, such as a half-circle wave as illustrated in the example of FIG. 13. Alternatively, the channels 1316 and the extensions 1312 can have another suitable shape including another wave shape (e.g., full wave, saw tooth wave, square wave, etc.).

In the examples of FIGS. 8 and 9, coolant can flow between the plates and between the posts to cool the switches.

FIG. 14 illustrates various example arrangements of switches of the inverter module 256 in the path of coolant. As shown in the top left, the switches may be arranged such that switches receive coolant one after another. As shown in the top right, one half of the switches may receive coolant flow in a first direction, while the other half of the switches may receive coolant flow in a second direction. The switches receive coolant one after each other in the top right example.

The middle left example illustrates that the switches may be arranged as to each receive coolant at the same time. The middle right example illustrates that one half of the switches may be arranged to receive coolant flowing in a first direction at the same while the other half of the switches may be arranged to receive coolant flowing in a second direction at the same time.

The bottom left example illustrates that groups of two or more of the switches may be arranged to receive coolant at the same time where the groups receive coolant at different times. The bottom right example illustrates that the switches may be disposed near a center wall of the coolant channel and coolant may flow toward the center wall.

Figure 15:
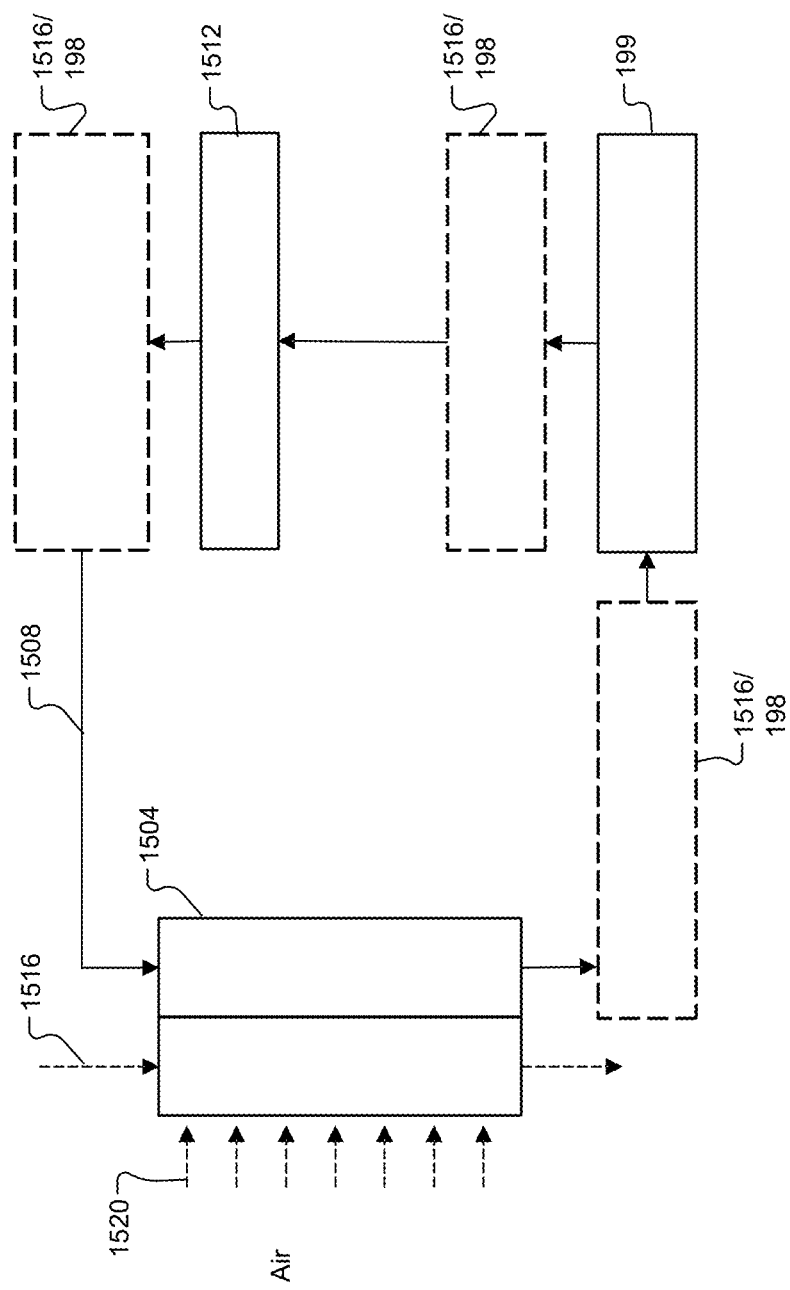
FIGS. 15 and 16 includes functional block diagrams of example cooling systems.

FIG. 15 includes a functional block diagram of an example cooling system. Heat exchanger 1504 transfers heat away from the coolant 1508 (and cools the coolant 1508) that flows through the switches 1512 of the inverter module 256. The coolant 1508 may be, for example, a liquid dielectric coolant or another suitable type of coolant. The heat exchanger 1504 may cool the coolant 1508 using a liquid 1516 and/or a gas, such as air 1520.

The coolant 1508 may flow from the heat exchanger 1504 to one or more components 1516 or the electric motor 198. The coolant 1508 may then flow to the battery 199. The coolant 1508 may flow from the battery to one or more components 1516 or the electric motor 198. The coolant 1508 may then flow to the switches 1512 of the inverter module 256. The coolant may then flow to one or more components 1516 or the electric motor 198 before returning to the heat exchanger 1504.

Figure 16:
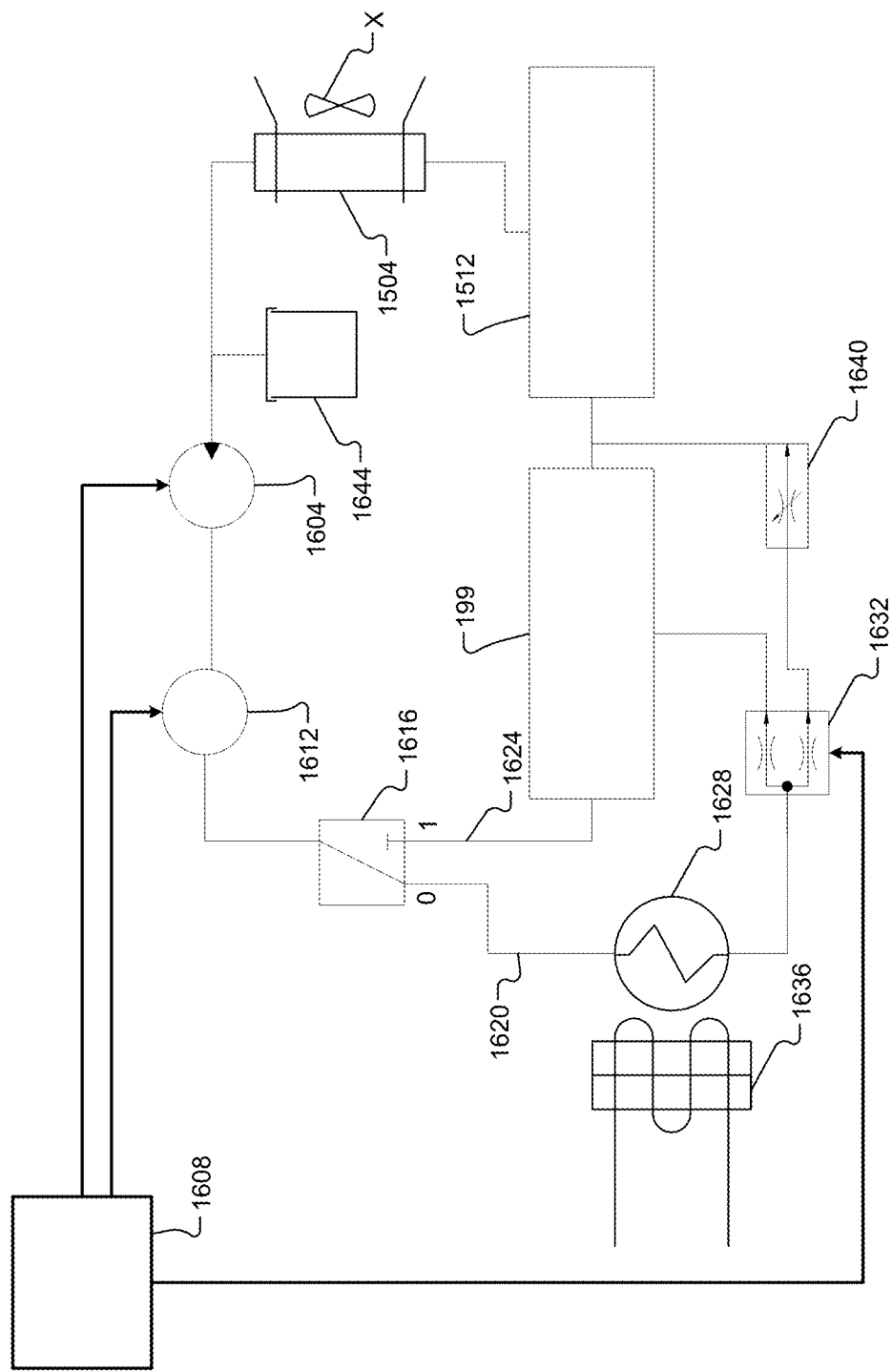

FIG. 16 is a functional block diagram of an example cooling system. A pump 1604 pumps coolant when the pump 1604 is on. A coolant control module 1608 controls whether the pump 1604 is on or off. The coolant control module 1608 may also control a speed of the pump 1604.

The pump 1604 pumps coolant to a heater 1612. The heater 1612 may be turned on to heat the coolant under some circumstances. The coolant control module 1608 may control whether the heater 1612 is on or off. Coolant output from the heater 1608 flows to a first valve 1616. When the first valve 1616 is in a first position (0), the first valve 1616 outputs coolant to a first coolant path 1620. When the first valve 1616 is in a second position (1), the first valve 1616 outputs coolant to a second coolant path 1624.

While the example of a leg of switches is provided, the present application is also applicable to a single switch disposed in the coolant.

Coolant in the first coolant path 1620 flows through a chiller 1628 before flowing to a second valve 1632. A heat exchanger 1636 of a heating ventilation and air conditioning (HVAC) system of the vehicle may be used to cool the chiller 1628. The chiller 1628 cools coolant flowing through the chiller 1628. Coolant in the second coolant path 1624 flows through the battery 199 and the inverter switches 1512 before flowing to the heat exchanger 1504. While the example of an air to liquid heat exchanger is provided, the heat exchanger 1504 may be a liquid to liquid heat exchanger as discussed above.

The second valve 1632 divides coolant flow to the battery 199 and to a third valve 1640. The third valve 1640 controls whether coolant output from the second valve 1632 flows to the inverter switches 1512. The coolant control module 1608 may control opening of the third valve 1640. Coolant output from the battery 199 may be lower than a temperature of the inverter switches 1512. Excess coolant may be stored in a tank 1644.

For a cold start of the vehicle, the coolant control module 1608 may turn on the heater 1612, actuate the first valve 1616 to the second (1) position, and close the third valve 1640. During normal operation, the coolant control module 1608 may turn or leave the heater 1612 off, actuate the first valve 1616 to the second (1) position, and close the third valve 1640. For cooling (of the battery 199 and the inverter switches 1512), the coolant control module 1608 may turn or leave the heater 1612 off, actuate the first valve 1616 to the first (0) position, and close the third valve 1640. For cooling of the inverter switches 1512 (and not the battery 199), the coolant control module 1608 may turn or maintain the heater 1612 off, actuate the first valve 1616 to the first (0) position, and open or vary an opening of the third valve 1640.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A switch cooling system comprising:
   a coolant channel;
   a switch of an inverter module that is disposed in the coolant channel, that is configured to be immersed in coolant in the coolant channel, and that includes:
      a first terminal disposed on a first plane and configured to connect to a direct current (DC) reference potential;
      a second terminal disposed on a second plane and configured to connect to an alternating current (AC) reference potential;
      a gate, an emitter, and a collector that are disposed between the first and second planes;
      first cooling features that extend away from the first and second planes, that directly contact the first terminal, and that are configured to allow coolant flow therethrough; and
      second cooling features that extend away from the first cooling features, the first plane, and the second plane, that directly contact the second terminal, and that are configured to allow coolant flow therethrough.

2. The switch cooling system of claim 1 wherein the first and second planes are parallel.

3. The switch cooling system of claim 1 wherein the first cooling features extend perpendicularly away from the first and second planes.

4. The switch cooling system of claim 1 wherein the second cooling features extend perpendicularly away from the first and second planes.

5. The switch cooling system of claim 1 further comprising a second switch of the inverter module that is disposed in the coolant channel, that is configured to be immersed in the coolant in the coolant channel, and that includes:
   a third terminal disposed on a third plane and configured to connect to a second DC reference potential;
   a second gate, a second emitter, and a second collector that are disposed between the second and third planes; and
   third cooling features that extend away from the second and third planes, that directly contact the third terminal, and that are configured to allow coolant flow therethrough.

6. The switch cooling system of claim 5 further comprising an electrical insulator that is disposed between (a) the gate, the emitter, and the collector and (b) the second gate, the second emitter, and the second collector.

7. The switch cooling system of claim 5 further comprising first, second, and third electrical conductors that are electrically connected to the first, second, and third terminals and that extend through the coolant channel to outside of the coolant channel.

8. The switch cooling system of claim 1 wherein the first cooling features include members that extend perpendicularly to the first and second planes.

9. The switch cooling system of claim 1 wherein the first features include:
   a plurality of parallel plates; and
   posts that are separate the plates from each other.

10. The switch cooling system of claim 9 wherein the posts extend perpendicularly to the parallel plates.

11. The switch cooling system of claim 9 wherein the posts are cylindrical.

12. The switch cooling system of claim 11 wherein the posts all have the same diameter.

13. The switch cooling system of claim 11 wherein the posts all have the same pitch.

14. The switch cooling system of claim 11 wherein the posts include first posts having a first diameter and second posts having a second diameter.

15. The switch cooling system of claim 14 wherein the first posts have a first pitch and the second posts have a second pitch, wherein the first pitch is different than the second pitch.

16. The switch cooling system of claim 1 wherein the first cooling features include:
   a first layer including an inlet, an outlet, a first portion that is fluidly connected to the inlet, and a second portion that is fluidly connected to the outlet;
   a second layer including a third portion that is fluidly connected to the first and second portions of the first layer; and
   a third layer including a fourth portion that is fluidly connected to the first and second portions.

17. The switch cooling system of claim 1 wherein the first cooling features:
   two parallel plates; and
   a helical member having a first direction of rotation and disposed between the two parallel plates.

18. The switch cooling system of claim 17 wherein the first cooling features further include:

a second helical member having a second direction of rotation and disposed between the two parallel plates.

19. The switch cooling system of claim 18 wherein the second direction of rotation is different than the first direction of rotation.

20. The switch cooling system of claim 1 wherein the first cooling features include:
- a first material having uniform openings configured to allow coolant flow therethrough; and
- a second material having non-uniform openings configured to allow coolant flow therethrough.

* * * * *